United States Patent
Tsuji

(10) Patent No.: US 9,584,125 B2
(45) Date of Patent: Feb. 28, 2017

(54) INTERFACE CIRCUIT

(71) Applicant: ROHM CO., LTD., Ukyo-Ku, Kyoto (JP)

(72) Inventor: Masanobu Tsuji, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/750,337

(22) Filed: Jun. 25, 2015

(65) Prior Publication Data

US 2015/0381180 A1    Dec. 31, 2015

(30) Foreign Application Priority Data

Jun. 25, 2014  (JP) .................. 2014-130714

(51) Int. Cl.
*H03L 5/00*      (2006.01)
*H03K 19/0185*   (2006.01)
*H03K 19/00*     (2006.01)
*H03K 19/0175*   (2006.01)

(52) U.S. Cl.
CPC .. *H03K 19/018521* (2013.01); *H03K 19/0005* (2013.01); *H03K 19/017509* (2013.01)

(58) Field of Classification Search
CPC ... H03K 19/017509; H03K 5/02; G06F 3/044; G06F 3/0416
USPC .................. 327/306, 333; 326/61–62, 80–81
See application file for complete search history.

(56) References Cited

U.S. PATENT DOCUMENTS

| | | | | |
|---|---|---|---|---|
| 6,777,992 | B2* | 8/2004 | Ziesler | H03K 3/356121 327/208 |
| 7,368,970 | B2* | 5/2008 | Lin | H03K 3/356113 326/62 |
| 7,768,308 | B2* | 8/2010 | Maede | H03K 3/356113 326/68 |
| 7,956,642 | B2* | 6/2011 | Lee | H03K 3/356113 326/68 |
| 2010/0123506 | A1* | 5/2010 | Vu | H03F 3/45183 327/333 |

FOREIGN PATENT DOCUMENTS

JP        2003235251 A    8/2003

\* cited by examiner

*Primary Examiner* — Dinh T Le
(74) *Attorney, Agent, or Firm* — Cantor Colburn LLP

(57) ABSTRACT

An interface circuit receives an input signal IN having a first voltage amplitude from a first circuit, and outputs an output signal OUT having a second voltage amplitude to a second circuit. A level shifter comprises a first CMOS inverter and a second CMOS inverter which are cross-coupled, and a current limiting circuit that limits a current that flows through the first CMOS inverter and the second CMOS inverter, and converts the input signal IN into an intermediate signal INT which is a differential signal. A latch circuit receives the intermediate signal INT from the level shifter, and switches its state according to the positive signal and the negative signal of the intermediate signal INT.

12 Claims, 13 Drawing Sheets

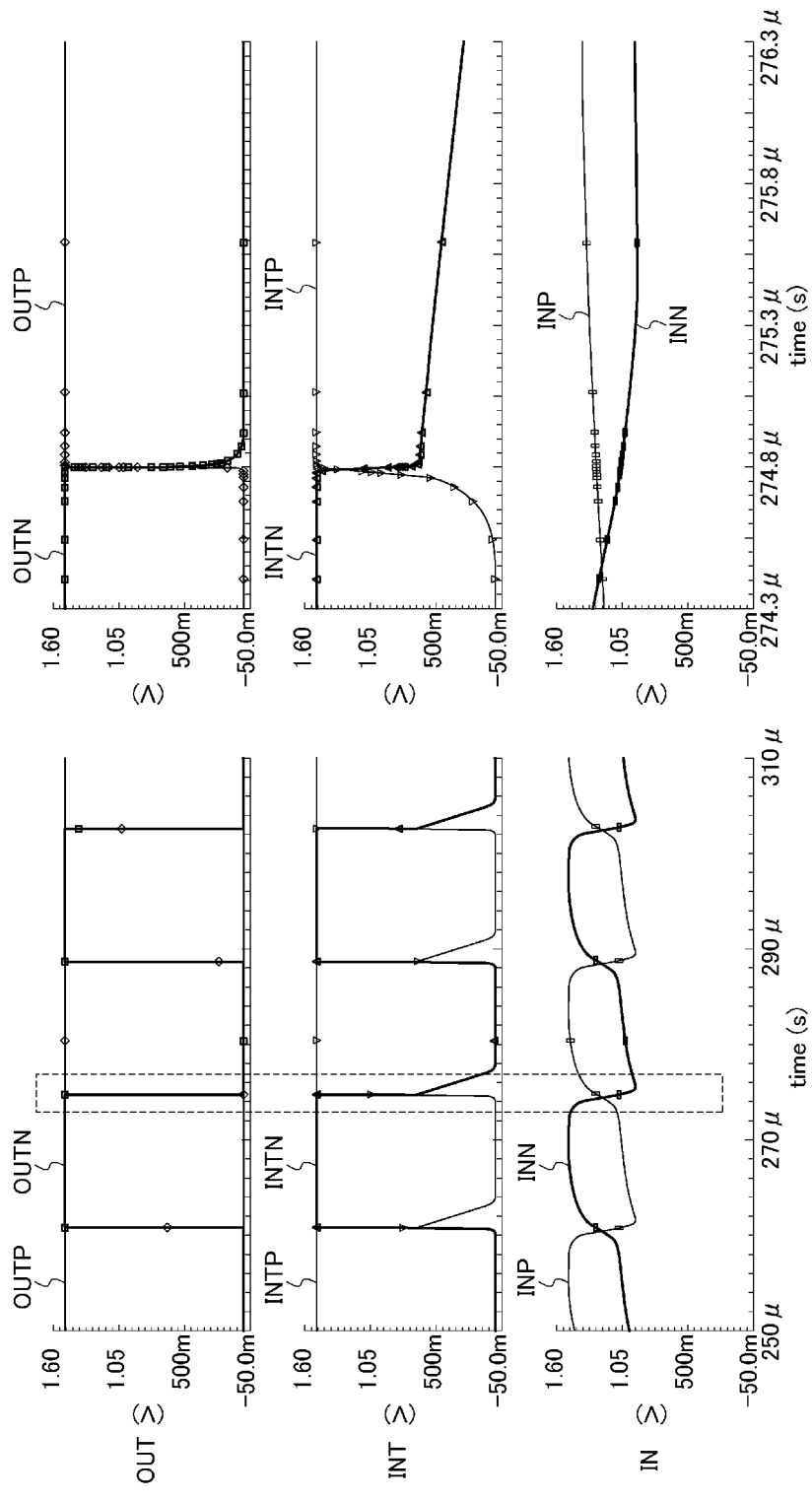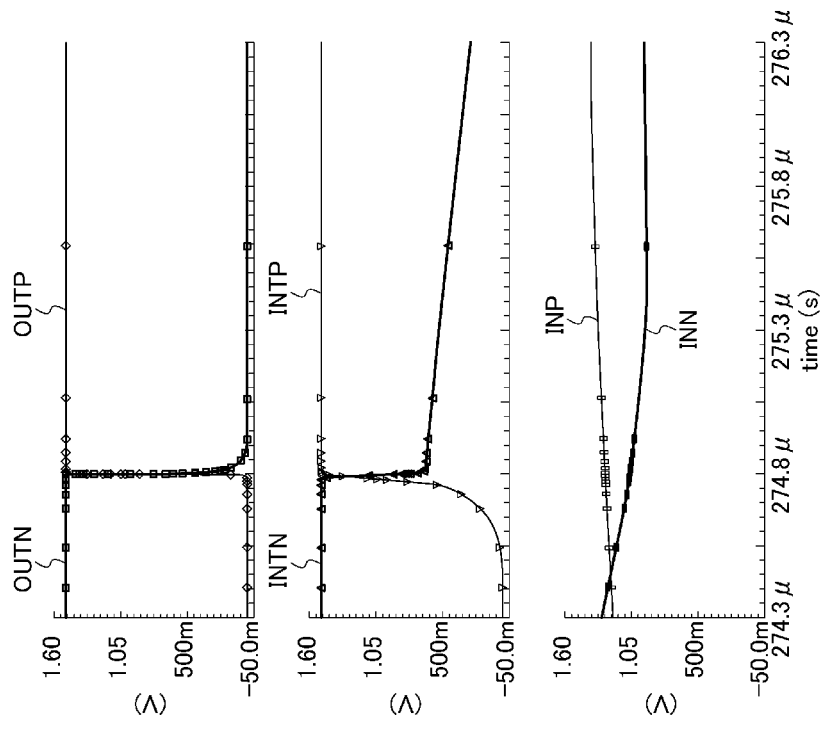

INTERFACE CIRCUIT

CROSS-REFERENCE TO RELATED APPLICATIONS

This application is based upon and claims the benefit of priority from the prior Japanese Patent Application No. 2014-130714, filed on Jun. 25, 2014, the entire contents of which are incorporated herein by reference.

BACKGROUND OF THE INVENTION

Field of the Invention

The present invention relates to an interface circuit that allows a digital signal to be supplied or received between two circuit blocks.

Description of the Related Art

In recent years, there has been an increased demand for a technique for providing a semiconductor integrated circuit or a circuit system (which will collectively be referred to as a "semiconductor integrated circuit" hereafter) with reduced power consumption. In order to meet such a demand, the semiconductor integrated circuit is configured as multiple circuit blocks, and is configured such that each circuit block operates with a different optimum voltage amplitude or otherwise with a different power supply voltage.

FIG. 1 is a block diagram showing a semiconductor integrated circuit including multiple circuit blocks. A semiconductor integrated circuit $2r$ includes a first circuit 4, a second circuit 6, and an interface circuit $10r$. The first circuit 4 is connected to a power supply rail configured to supply a first power supply voltage $V_{DD1}$ and a ground voltage $V_{SS}$. The internal digital signal of the first circuit 4 swings in a binary manner between the first power supply voltage $V_{DD1}$ as high level and the ground voltage $V_{SS}$ as low level. The second circuit 6 is connected to a power supply rail configured to supply a second power supply voltage $V_{DD2}$ and the ground voltage $V_{SS}$. The internal digital signal in the second circuit 6 swings in a binary manner between the second power supply voltage $V_{DD2}$ as high level and the ground voltage $V_{SS}$ as low level.

Description will be made below regarding an arrangement in which $V_{DD1} < V_{DD2}$. The interface circuit $10r$ is interposed between the first circuit 4 and the second circuit 6. The interface circuit $10r$ receives an input signal IN that transits between $V_{SS}$ and $V_{DD1}$, converts the input signal IN into an output signal OUT that full-scale swings between $V_{SS}$ and $V_{DD2}$, and outputs the output signal OUT thus converted to the second circuit 6 configured as a downstream stage.

As a result obtained by investigating the current consumption (power consumption) required for the overall operation of the semiconductor integrated circuit $2r$, the following problem has been found.

Description will be made regarding an arrangement in which the second circuit 6 is configured as a digital circuit according to a CMOS (Complementary Metal Oxide Semiconductor) architecture. The current consumption of the digital circuit is represented by the sum total of (i) loss due to the charge/discharge current used to charge/discharge a parasitic capacitor that occurs due to a transistor, wiring, or the like, (ii) loss due to a through current that flows through a CMOS inverter configured as an internal component, (iii) loss due to leak current, etc. The ratio of such current loss components varies according to the circuit scale, the circuit operating condition, and the like. The through current flows when the upper-side PMOS transistor and the lower-side NMOS transistor that form the CMOS inverter turn on at the same time. Specifically, the through current flows when the input signal of the CMOS inverter is set to an intermediate voltage level between the high-level voltage and the low-level voltage, i.e., when transition occurs in the input signal. In a digital circuit that operates together with an upstream circuit that operates with low power consumption, the signal received from the upstream-stage circuit transits at a low speed. Thus, in particular, such an arrangement leads to a problem of current loss due to a through current that occurs when a signal having such a low transition speed propagates through the digital circuit.

With the semiconductor integrated circuit $2r$ shown in FIG. 1, in order to reduce the power consumption of the second circuit 6, the through current that occurs in the CMOS inverter configured as a component of the semiconductor integrated circuit 2 may preferably be reduced. In order to reduce the through current, the input signal may preferably be configured to have an increased transition speed (through rate).

FIGS. 2A and 2B are circuit diagrams each showing an interface circuit $10r$ investigated by the present inventor. It should be noted that the interface circuit $10r$ cannot be recognized as a known technique. The interface circuit $10r$ shown in FIG. 2A includes a voltage comparator 200. The voltage comparator 200 requires the supply of a stationary current Ic regardless of whether or not there is transition of the signal, leading to large power consumption. Furthermore, in order to raise the transition speed of the output signal OUT, there is a need to increase the amount of current Ic. Thus, such an arrangement is unsuitable for such a usage having a strong demand for reducing power consumption.

The interface circuit $10r$ shown in FIG. 2B is configured as a level shifter 202 including two cross-coupled CMOS inverters 204 and 206. During a period in which there is no level transition in the signal, the level shifter 202 requires no current consumption. However, in a case in which the input signal INP/INN has a low transition speed, a through current flows in a transition period. This leads to difficulty in providing reduced power consumption.

SUMMARY OF THE INVENTION

The present invention has been made in order to solve such a problem. Accordingly, it is an exemplary purpose of an embodiment of the present invention to provide an interface circuit which is capable of generating a signal that transits with a high speed, and which is capable of providing reduced power consumption.

An embodiment of the present invention relates to an interface circuit that receives an input signal having a first voltage amplitude from a first circuit, and that outputs an output signal to a second circuit that operates with a second voltage amplitude. The interface circuit comprises a level shifter and a latch circuit. The level shifter comprises a first CMOS inverter and a second CMOS inverter which are cross-coupled, and a current limiting circuit that limits a current that flows through the first CMOS inverter and the second CMOS inverter. The interface circuit converts the input signal into an intermediate signal which is a differential signal. The latch circuit receives the intermediate signal from the level shifter, and switches its state according to a positive signal and an negative signal of the intermediate signal.

With such an embodiment, the level shifter configured as a first stage including the current limiting circuit amplifies the amplitude of the input signal (which is also referred to as "level shifting") while suppressing an increase in power consumption. Furthermore, the latch circuit configured as a second stage generates an output signal by further raising the transition rate of the intermediate signal having an amplitude thus amplified by the level shifter configured as a first stage, and supplies the output signal thus generated to the second circuit configured as a downstream stage.

[PMOS input configuration] Also, the first CMOS inverter may comprise: a first NMOS transistor having its gate connected to an output of the second CMOS inverter; and a first PMOS transistor having its gate receiving the positive signal of the input signal. Also, the second CMOS inverter may comprise: a second NMOS transistor having its gate connected to an output of the first CMOS inverter; and a second PMOS transistor having its gate receiving the negative signal of the input signal.

Such an arrangement is capable of appropriately shifting the voltage level of the input signal which swings between the power supply voltage of the interface signal as high level, and a voltage that is lower than the power supply voltage as low level.

Also, the latch circuit may comprise a pair of cross-coupled NAND gates.

In a case in which the positive signal and the negative signal of the intermediate signal each have a low transition speed at their negative edges, the positive signal and the negative signal have the potential to both be set to high level at the same time. In order to solve such a problem, a NAND-type latch circuit is employed configured to allow a state in which both the set and reset signals are set to high level, thereby preventing the circuit operation from becoming unstable.

Also, the first CMOS inverter may further comprise a third NMOS transistor arranged between the first NMOS transistor and the first PMOS transistor, and having its gate receiving the positive signal of the input signal. Also, the second CMOS inverter may further comprise a fourth NMOS transistor arranged between the second NMOS transistor and the second PMOS transistor, and having its gate receiving the negative signal of the input signal.

By providing the CMOS inverter with a MOS transistor arranged such that the input signal is input to its gate, such an arrangement is capable of reducing the effect on the input signal of parasitic capacitance due to mirror effects, thereby suppressing degradation in the through rate of the input signal.

Also, the first CMOS inverter further may comprise a fifth PMOS transistor arranged between the first NMOS transistor and the first PMOS transistor, and having its gate receiving a ground voltage. Also, the second CMOS inverter may further comprise a sixth PMOS transistor arranged between the second NMOS transistor and the second PMOS transistor, and having its gate receiving the ground voltage.

By providing the CMOS inverter with a MOS transistor arranged such that a fixed voltage is input to its gate, such an arrangement is capable of reducing the effect on the intermediate signal and the positive feedback control operation of parasitic capacitance due to mirror effects, and/or is capable of raising the rate at which the impedance of the MOS transistor that functions as a load is changed, thereby providing the intermediate signal with an improved through rate.

[NMOS input configuration] Also, the first CMOS inverter may comprise: a first NMOS transistor having its gate receiving the positive signal of the input signal; and a first PMOS transistor having its gate connected to an output of the second CMOS inverter. Also, the second CMOS inverter may comprise: a second NMOS transistor having its gate receiving the negative signal of the input signal; and a second PMOS transistor having its gate connected to an output of the first CMOS inverter.

Such an arrangement is capable of appropriately shifting the voltage level of the input signal that swings between the ground voltage as low level and a voltage that is higher than the ground voltage as high level.

Also, the latch circuit may comprise a pair of cross-coupled NOR gates.

In a case in which the positive signal and the negative signal of the intermediate signal each have a low transition speed at their positive edges, the positive signal and the negative signal have the potential to both be set to low level at the same time. In order to solve such a problem, a NOR-type latch circuit is employed configured to allow a state in which both the set and reset signals are set to low level, thereby preventing the circuit operation from becoming unstable.

Also, the first CMOS inverter may further comprise a first NMOS transistor, a first PMOS transistor, and a fifth MOS transistor arranged between the first NMOS transistor and the first PMOS transistor, and having its gate receiving a predetermined electric potential. Also, the second CMOS inverter may further comprise a second NMOS transistor, a second PMOS transistor, and a sixth MOS transistor arranged between the second NMOS transistor and the second PMOS transistor, and having its gate receiving a predetermined electric potential.

By providing the CMOS inverter with a MOS transistor arranged such that the input signal is input to its gate, such an arrangement is capable of reducing the effect on the input signal of parasitic capacitance due to mirror effects, thereby suppressing degradation in the through rate of the input signal.

Also, the first CMOS inverter may further comprise a fifth NMOS transistor arranged between the first NMOS transistor and the first PMOS transistor, and having its gate receiving a power supply voltage. Also, the second CMOS inverter may further comprise a sixth NMOS transistor arranged between the second NMOS transistor and the second PMOS transistor, and having its gate receiving a power supply voltage.

By providing the CMOS inverter with a MOS transistor arranged such that a fixed voltage is input to its gate, such an arrangement is capable of reducing the effect on the intermediate signal and the positive feedback control operation of parasitic capacitance due to mirror effects, and/or is capable of raising the rate at which the impedance of the MOS transistor that functions as a load is changed, thereby providing the intermediate signal with an improved through rate.

Also, the current limiting circuit may comprise a current source connected to a source of each of the first NMOS transistor and the second NMOS transistor. Also, the current limiting circuit may comprise a current source connected to sources of the first PMOS transistor and the second PMOS transistor.

Also, the interface circuit may monolithically be integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By monolithically integrating the circuit on a single chip, such an arrangement allows the circuit area to be reduced, and allows the circuit elements to have uniform characteristics.

Another embodiment of the present invention relates to a semiconductor integrated circuit. The semiconductor integrated circuit comprises: a first circuit that generates an input signal having a first voltage amplitude; a second circuit provided with a power supply rail having a voltage difference that is greater than the first voltage amplitude; and any one of the aforementioned interface circuits each configured to receive an input signal from the first circuit, and to output an output signal to the second circuit.

Also, the first circuit may comprise an analog core. Also, the second circuit may comprise a digital core.

Also, the first circuit may comprise an oscillator that generates a clock signal. Also, the interface circuit may receive the clock signal, and may output a signal to the second circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 7A and 7B are simulation waveform diagrams each showing a simulated operation of the interface circuit shown in FIG. 4;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 1:
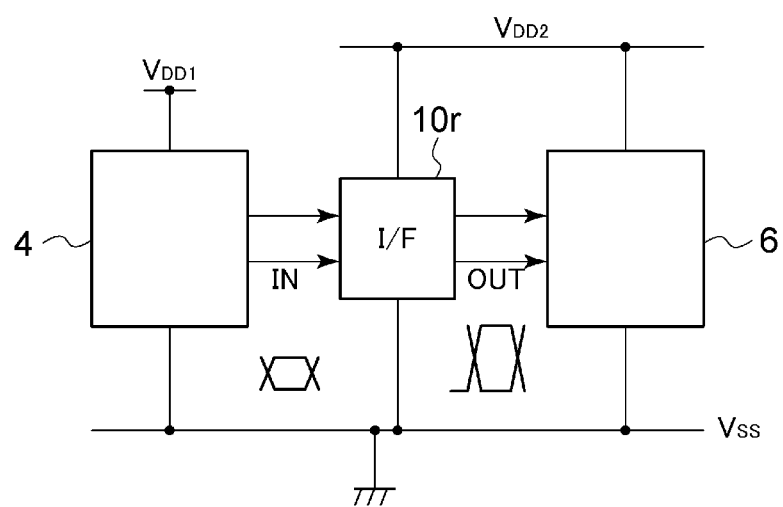
FIG. 1 is a block diagram showing a semiconductor integrated circuit including multiple circuit blocks.
Figure 2A:
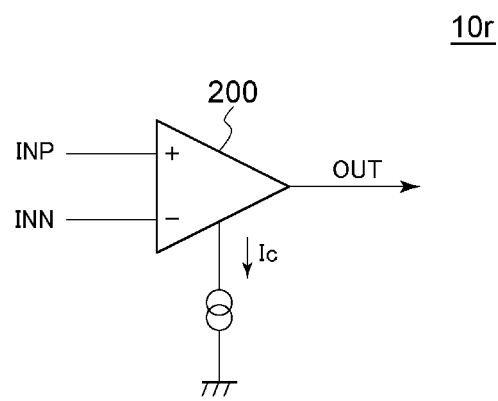
FIGS. 2A and 2B are circuit diagrams each showing an interface circuit investigated by the present inventor.
Figure 2B:
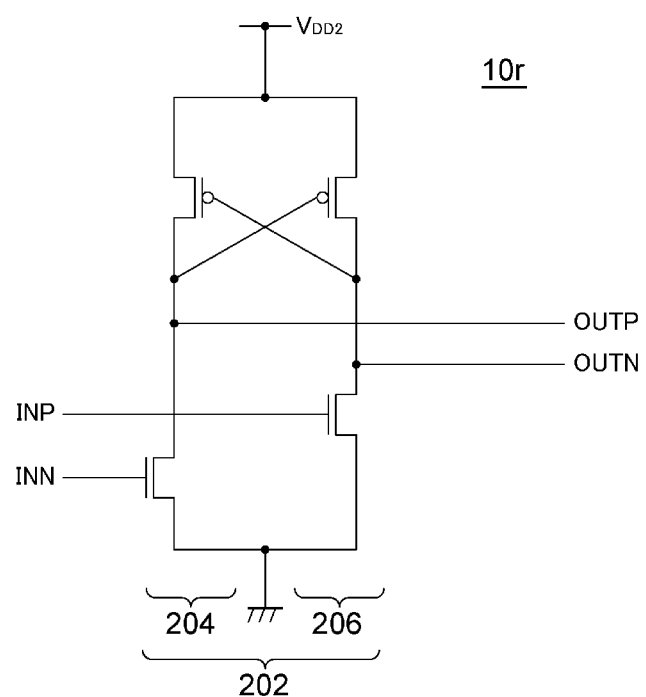
Figure 3:
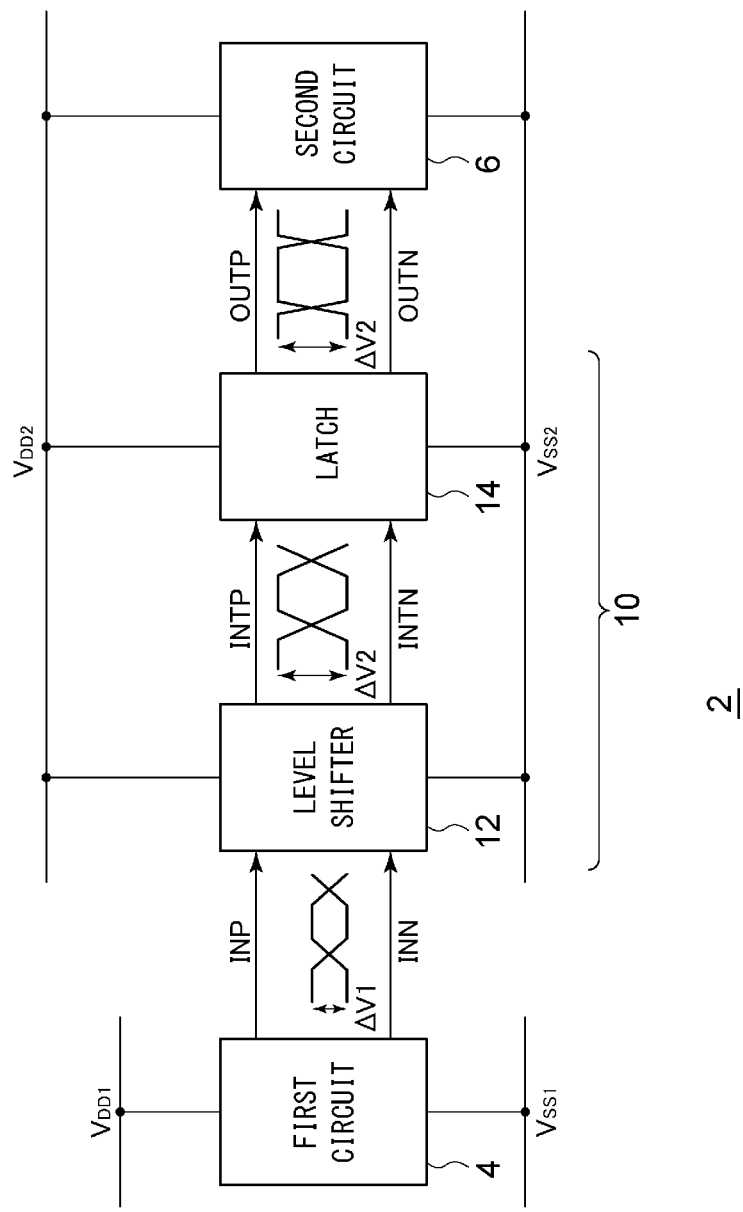
FIG. 3 is a block diagram showing a semiconductor integrated circuit including an interface circuit according to an embodiment.

FIG. 3 is a block diagram showing a semiconductor integrated circuit 2 including an interface circuit 10 according to an embodiment. The semiconductor integrated circuit 2 includes a first circuit 4, a second circuit 6, and an interface circuit 10. The first circuit 4 operates using a power supply rail configured to supply the power supply voltage $V_{DD1}$ and the ground voltage $V_{SS1}$. The second circuit 6 operates using a power supply rail configured to supply the power supply voltage $V_{DD2}$ and the ground voltage $V_{SS2}$. It should be noted that the ground voltages $V_{SS1}$ and $V_{SS2}$ respectively used in the first circuit 4 and the second circuit 6 may be the same. Also, the power supply voltages $V_{DD1}$ and $V_{DD2}$ may be the same. Also, an arrangement may be made in which the ground voltages $V_{SS1}$ and $V_{SS2}$ are the same, and the power supply voltages $V_{DD1}$ and $V_{DD2}$ are the same.

The first circuit 4 generates a digital signal (input signal) IN configured as a binary signal that can be set to high level or otherwise low level, which is the origin of a signal OUT that is used in the second circuit 6. The input signal IN has a first voltage amplitude $\Delta V1$.

In a case in which the first circuit 4 is required to operate with reduced power consumption, the first circuit 4 is configured to operate with a reduced amount of current. As a result, such an arrangement leads to a reduced transition speed (a low through rate) of the input signal IN output from the first circuit 4. In a case in which such a signal IN having a low through rate is supplied to the second circuit 6 configured as a downstream-stage digital circuit without improving the through rate, such an arrangement leads to an increase in the through current in the second circuit 6, resulting in increased power consumption. In order to solve such a problem, the interface circuit 10 converts the input signal IN having the first voltage amplitude $\Delta V1$ and a low through rate into the output signal OUT having a second voltage amplitude $\Delta V2$ and an improved through rate.

For example, the input signal IN may be configured as a digital signal having a level that can be set to $V_{SS}$ as low level and $V_{DD1}$ as high level. Also, the input signal IN may be configured as a digital signal that can be set to $V_{DD2}$ as high level and ($V_{DD2}-\Delta V2$) as low level. Also, the output signal OUT may be configured as a digital signal having a level that can be set to $V_{DD2}$ as high level and $V_{SS}$ as low level. In the present invention, the level diagram of a signal is not restricted in particular. Description will be made below regarding an arrangement in which the input signal IN is configured as a differential signal.

The interface circuit 10 is configured to have a differential input interface and a differential output interface. The interface circuit 10 includes a level shifter 12 and a latch circuit 14.

The level shifter 12 converts the input signal IN into an intermediate signal INT configured as a differential signal having the second voltage amplitude ΔV2.

The latch circuit 14 is configured as an RS flip-flop (which is also referred to as an "SR flip-flop") that receives the intermediate signal INT from the level shifter 12, and that switches its state according to a predetermined edge (positive edge or otherwise negative edge) of each of a positive signal INTP and an negative signal INTN of the intermediate signal INT.

The above is a basic configuration of the interface circuit 10. The interface circuit 10 according to the present invention encompasses various kinds of circuits that can be conceived based on the circuit diagram shown in FIG. 3. Description will be made regarding a specific example configuration of the interface circuit 10.

Figure 4:
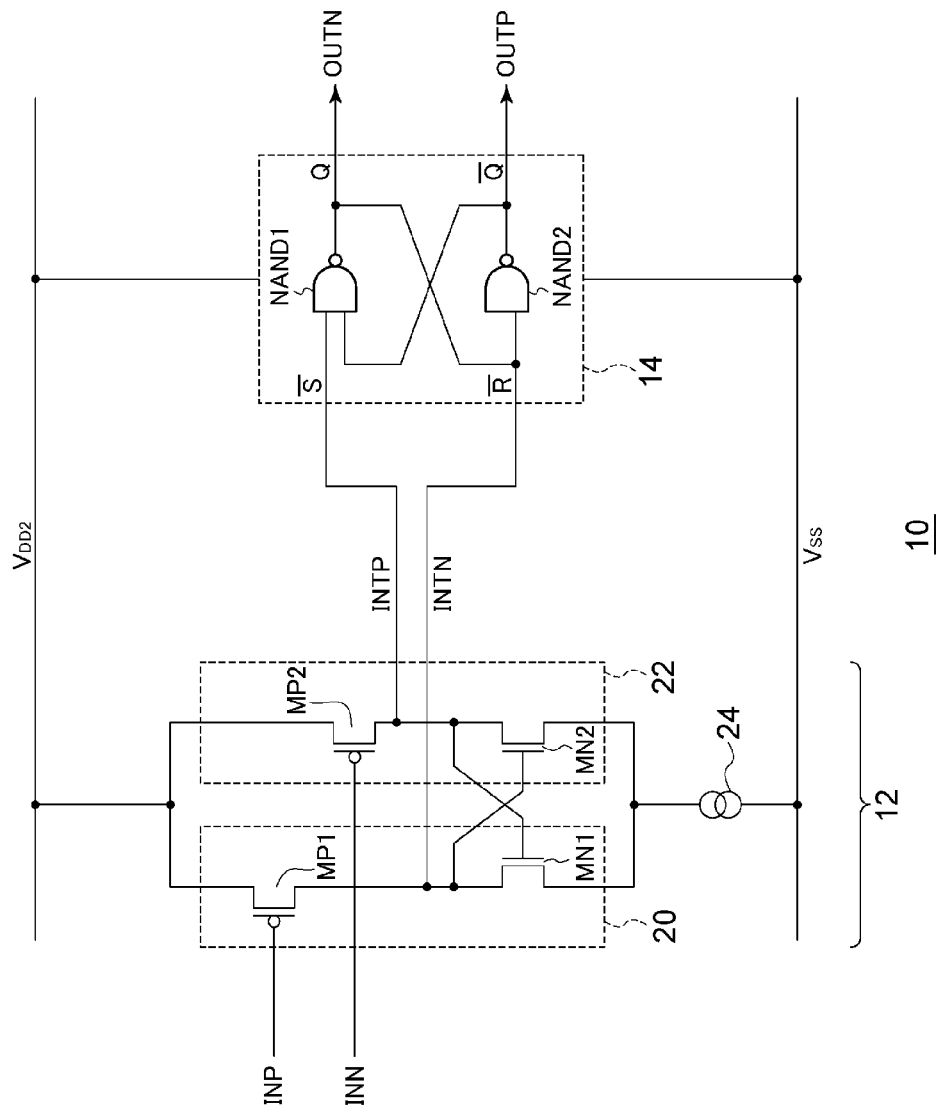
FIG. 4 is a circuit diagram showing the interface circuit shown in FIG. 3.

FIG. 4 is a circuit diagram showing the interface circuit 10 shown in FIG. 3. In this example configuration, the input signal IN is configured as a binary signal that switches between $V_{DD2}$ as high level and ($V_{DD2}-\Delta V1$) as low level.

The level shifter 12 includes a first CMOS inverter 20, a second CMOS inverter 22, and a current limiting circuit 24. The first CMOS inverter 20 and the second CMOS inverter 22 are cross-coupled. The first COMS inverter 20 inverts the positive signal INP of the input signal IN so as to generate the negative signal INTN of the intermediate signal INT. The second CMOS inverter 22 inverts the negative signal INN of the input signal IN so as to generate the positive signal INTP of the intermediate signal INT.

The current limiting circuit 24 limits the current that flows through the first CMOS inverter 20 and the second CMOS inverter 22.

The latch circuit 14 is configured as an SR flip-flop (which is also referred to as an "RS flip-flop"). The latch circuit 14 is arranged such that its set terminal #S ("#" represents logical inversion) and its reset terminal #R are each connected to a corresponding output of the first CMOS inverter 20 or the second CMOS inverter 22 of the level shifter 12.

The first CMOS inverter 20 includes a first NMOS transistor MN1 and a first PMOS transistor MP1. The positive signal INP of the input signal IN is input to the gate of the first PMOS transistor MP1. The gate of the first NMOS transistor MN1 is connected to the output of the second CMOS inverter 22.

Similarly, the second CMOS inverter 22 includes a second NMOS transistor MN2 and a second PMOS transistor MP2. The negative signal INN of the input signal IN is input to the gate of the second PMOS transistor MP2. The gate of the second NMOS transistor MN2 is connected to the output of the first CMOS inverter 20.

The current limiting circuit 24 includes a current source arranged between the ground line $V_{SS}$ and both the first CMOS inverter 20 and the second CMOS inverter 22.

The latch circuit 14 includes a pair of cross-coupled NAND gates NAND1 and NAND2.

Figure 5:
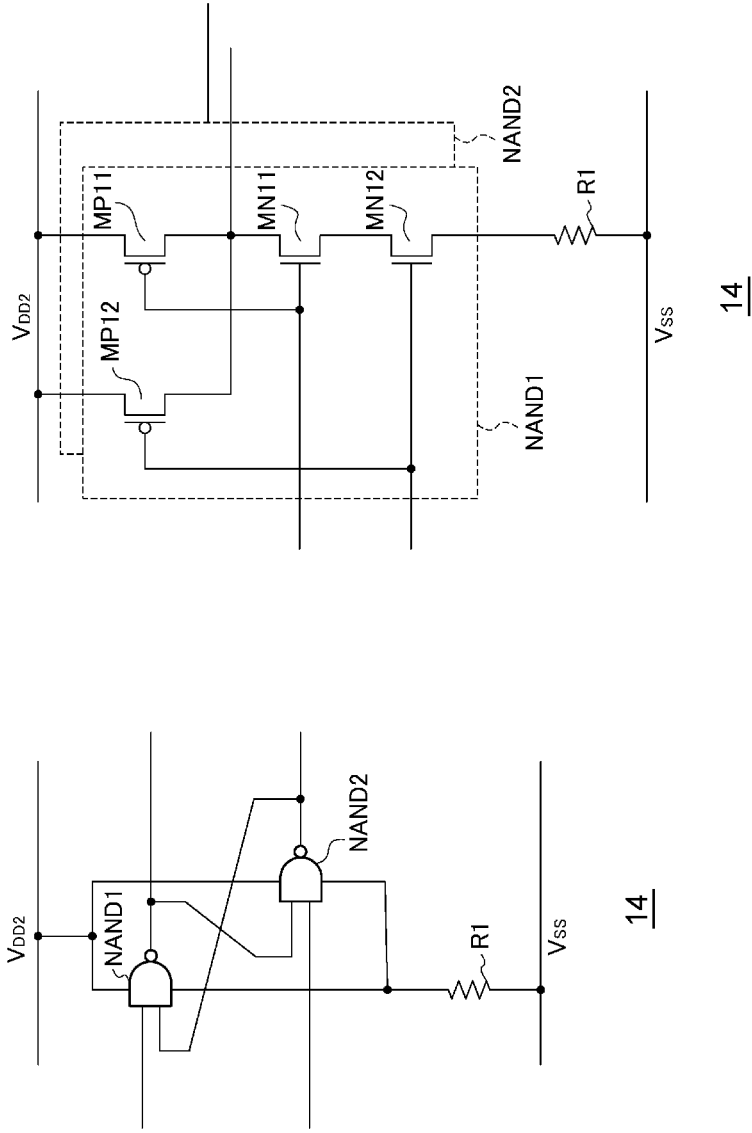
FIGS. 5A and 5B are circuit diagrams each showing a specific example configuration of a latch circuit.

FIGS. 5A and 5B are circuit diagrams each showing a specific example configuration of the latch circuit 14.

As shown in FIG. 5A, the latch circuit 14 may include a current-limiting resistor R1 between the ground line $V_{SS}$ and both the NAND gates NAND1 and NAND2. The resistor R1 may be configured as a polysilicon resistor, a diffused resistor, or a well resistor. Also, the resistor R1 may be configured using on-resistance provided by a transistor that has been appropriately biased. Also, a desired combination of these may be employed. That is to say, the configuration of the resistor R1 is not restricted in particular.

FIG. 5B shows a configuration example of the NAND gate. The NAND gate has a CMOS configuration. Specifically, the NAND gate includes a pair of PMOS transistors MP11 and MP12 connected in parallel and a pair of NMOS transistors MN11 and MN12 connected in series.

The above is the configuration of the interface circuit 10 shown in FIG. 4. Next, description will be made regarding the operation thereof.

Figure 6:
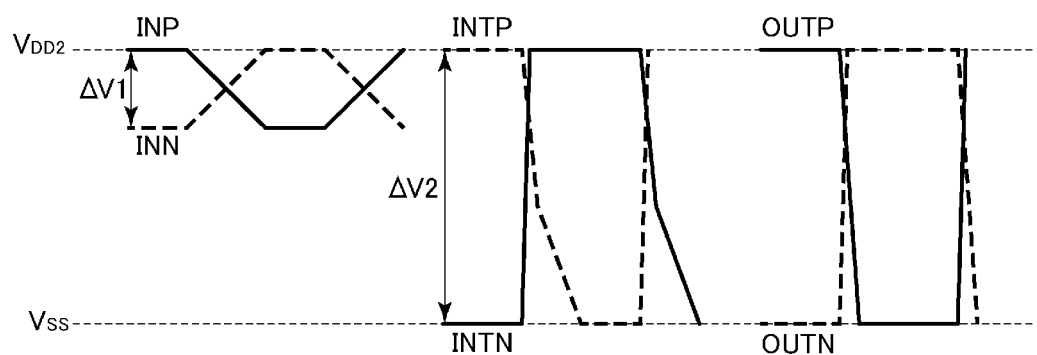
FIG. 6 is a waveform diagram showing a level diagram and a basic operation of the interface circuit shown in FIG. 4.

FIG. 6 is a waveform diagram showing a level diagram and a basic operation of the interface circuit 10 shown in FIG. 4. FIGS. 7A and 7B are simulation waveform diagrams for the interface circuit 10 shown in FIG. 4. FIG. 7B shows a waveform obtained by enlarging a part of the waveform enclosed by the broken line in FIG. 7A.

First, description will be made regarding the operation of the level shifter 12 configured as an upstream stage. The interface circuit 10 receives, as an input signal, a differential input signal IN having a weak amplitude that switches with a relatively low through rate. The level shifter 12 configured as a primary stage converts the differential input signal IN having such a weak amplitude into an intermediate differential signal INT having an increased through rate and having a large amplitude that full-scale swings between $V_{DD2}$ and $V_{SS}$.

The interface circuit 10 is configured such that the positive signal and the negative signal are symmetrical. Thus, description will be made below directing attention to transition of the positive signal INP of the input signal at a negative edge and transition of the negative signal INN of the input signal at a positive edge.

When the positive signal INP of the input signal transits from $V_{DD2}$ as high level to ($V_{DD2}-\Delta V1$) as low level, this raises the gate-source voltage of the first PMOS transistor MP1. In this state, a current $I_{MP1}$ flows from the power supply line $V_{DD2}$ to the first PMOS transistor MP1. With the on-resistance of the first NMOS transistor MN1 as $R_{MN1}$, the voltage value of the negative signal INTN of the intermediate signal is represented by the following Expression (1).

$$INTN = R_{MN1} \times I_{MP1} \quad (1)$$

Thus, when the current $I_{MP1}$ that flows through the first PMOS transistor MP1 rises, the negative signal INTN starts to transit toward $V_{DD2}$ as high level.

On the other hand, when the negative signal INN of the input signal transits from ($V_{DD2}-\Delta V1$) as low level to $V_{DD2}$ as high level, this reduces the current that flows through the second PMOS transistor MP2. In this state, the positive signal INTP of the intermediate signal starts to transit to $V_{SS}$ as low level.

$$INTP = R_{MN2} \times I_{MP2} \quad (2)$$

The positive signal INTP of the intermediate signal is input to the gate of the first NMOS transistor MN1. Accordingly, when the positive signal INTP transits to low level, such an arrangement provides positive feedback so as to rapidly increase the resistance value $R_{MN1}$ of the first NMOS transistor MN1. As a result, such an arrangement is capable of providing the negative signal INTN with an increased positive-edge transition speed (through rate) represented by Expression (1).

On the other hand, the negative signal INTN of the intermediate signal is input to the gate of the second NMOS transistor MN2. Accordingly, when the negative signal INTN transits to high level, such an arrangement provides positive feedback so as to rapidly reduce the resistance value $R_{MN2}$ of the second NMOS transistor MN2. As a result, such an arrangement is capable of providing the positive signal INTP with an increased negative-edge transition speed (through rate) represented by Expression (2).

During the transition of the intermediate signal INTP/INTN, a through current flows through each of the first CMOS inverter 20 and the second CMOS inverter 22, and this current can be limited by the current limiting circuit 24. It should be noted that the current limiting circuit 24 functions as a current source during only the transition period. After a transition is complete, the current paths provided by the first CMOS inverter 20 and the second CMOS inverter 22 are disconnected. In this stage, the current limiting circuit 24 does not function as a current source. That is to say, the current limiting circuit 24 is not configured to require current consumption at all times.

After a transition is complete, the positive signal INTP of the intermediate signal is fixed to the ground voltage $V_{SS}$. In this stage, the gate-source voltage of the first NMOS transistor MN1 becomes zero, and accordingly, the first NMOS transistor MN1 is completely turned off. Furthermore, the negative signal INTN of the intermediate signal is fixed to the power supply voltage $V_{DD2}$. In this stage, the drain-source voltage of the second PMOS transistor MP2 becomes zero, and accordingly, the second PMOS transistor MP2 is completely turned off. Thus, in this state, such an arrangement provides an operation with a through current of zero.

As described above, with the level shifter 12 configured as an upstream stage, such an arrangement is capable of converting the input signal IN into an intermediate signal having an expanded amplitude range and increased through rate while suppressing the amount of through current so as to provide reduced power consumption, and is capable of supplying such an intermediate signal to the latch circuit 14 configured as a downstream stage.

Next, description will be made regarding the operation of the latch circuit 14 configured as a downstream stage. The latch circuit 14 receives the intermediate signal INTP/INTN that full-scale swings between $V_{DD2}$ and $V_{SS}$. Description will be made regarding the operation of an arrangement employing the CMOS NAND gate shown in FIG. 5B. When the negative signal INTN transits to $V_{DD2}$ as high level, on the NAND1 side, the transistor MP11 turns off, and the transistor MN11 turns on. In this stage, the transistor MN12 is maintained in the off state. Thus, in this state, a through current does not flow. On the other hand, when the positive signal INTP transits to being fixed at $V_{SS}$ as low level, on the NAND2 side, the transistor MP11 turns on, and the transistor MN11 turns off. Thus, the output OUTN is switched to $V_{DD2}$ as high level. Subsequently, the output OUTP is switched to $V_{SS}$ as low level. In this manner, there is a mutually complementary relationship in the P signal transition of the latch circuit 14. Thus, such an arrangement provides the latch circuit 14 with a high through rate and small through current.

The above is the operation of the interface circuit 10.

The interface circuit 10 thus configured is capable of generating a signal OUT with a high transition speed while reducing power consumption. Furthermore, by supplying the output signal OUTP/OUTN having such a high through rate to the second circuit 6 configured as a downstream stage, such an arrangement is capable of reducing the amount of through current that occurs in a CMOS circuit included in the second circuit 6, thereby providing reduced power consumption in the overall system operation.

With the interface circuit 10 shown in FIG. 4, the level shifter 12 configured as an upstream-stage has a PMOS input configuration. Thus, the intermediate signal INTP/INTN has a lower through rate at the negative edge than that at the positive edge. Thus, such an arrangement has the potential to set both the signal components INTP and INTN to high level at the same time. Thus, the latch circuit 14 configured as a downstream stage is provided with a NAND-type SR latch configured such that high-level/high-level input is allowed and low-level/low-level input is prohibited. Such an arrangement provides the interface circuit 10 with improved stability.

In addition, by providing the latch circuit 14 with the resistor R1 used for limiting current, such an arrangement further reduces the operation current required for the latch circuit 14.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 8:
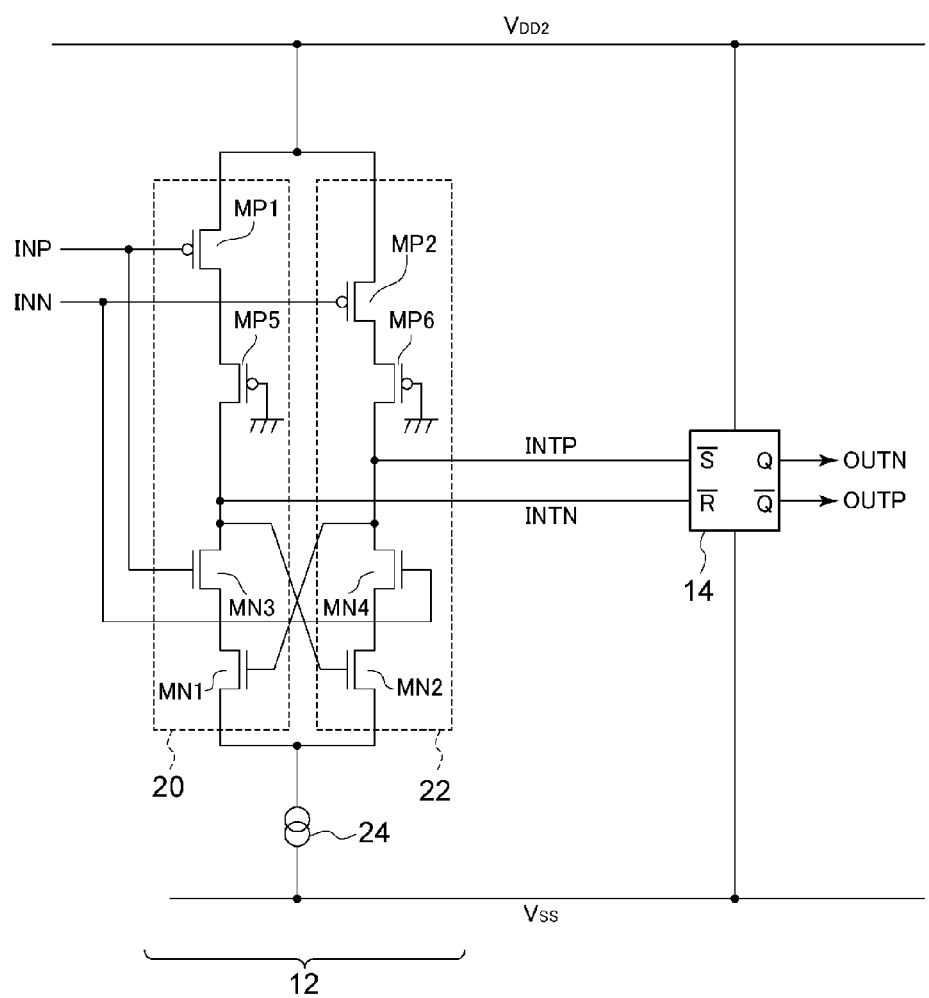
FIG. 8 is a circuit diagram showing an interface circuit according to a first modification.

FIG. 8 is a circuit diagram showing the interface circuit 10 according to a first modification. The interface circuit 10 includes the level shifter 12 having a configuration that differs from that shown in FIG. 4.

The first feature is that the interface circuit 10 further includes a third NMOS transistor MN3 and a fourth NMOS transistor MN4. The third NMOS transistor MN3 is interposed between the first NMOS transistor MN1 and the first PMOS transistor MP1. The positive signal INP of the input signal IN is input to the gate of the third NMOS transistor MN3. The fourth NMOS transistor MN4 is interposed between the second NMOS transistor MN2 and the second PMOS transistor MP2. The negative signal INN of the input signal IN is input to the gate of the fourth NMOS transistor MN4.

By interposing the NMOS transistors MN3 and MN4 arranged such that the input signal is input to their gates, such an arrangement is capable of reducing the effect on the input signal IN of a parasitic capacitance due to mirror effects. Thus, such an arrangement suppresses reduction in the through rate of the input signal IN.

The second feature is that the interface circuit 10 further includes a fifth PMOS transistor MP5 and a sixth PMOS transistor MP6

The fifth PMOS transistor MP5 is interposed between the first NMOS transistor MN1 and the first PMOS transistor MP1. More specifically, the fifth PMOS transistor MP5 is arranged between the third NMOS transistor MN3 and the first PMOS transistor MP1 such that the ground voltage is supplied to its gate. The sixth PMOS transistor MP6 is interposed between the second NMOS transistor MN2 and the second PMOS transistor MP2. More specifically, the sixth PMOS transistor MP6 is arranged between the fourth NMOS transistor MN4 and the second PMOS transistor MP2 such that the ground voltage is supplied to its gate.

By interposing the MOS transistors MP5 and MP6 arranged such that a fixed voltage is supplied to their gates, such an arrangement is capable of reducing the effect on the intermediate signal and the positive feedback control operation of a parasitic capacitance due to mirror effects, and/or of raising the impedance switching speed of each of the MOS transistors MN1 and MN2 that each function as a load, thereby providing the intermediate signal with an improved through rate.

[Second Modification]

In FIG. 8, the third NMOS transistor MN3 and the fourth NMOS transistor MN4 may be omitted, and only the fifth PMOS transistor MP5 and the sixth PMOS transistor MP6 may be provided. Conversely, only the third NMOS transistor MN3 and the fourth NMOS transistor MN4 may be provided, and the fifth PMOS transistor MP5 and the sixth PMOS transistor MP6 may be omitted.

[Third Modification]

Figure 9:
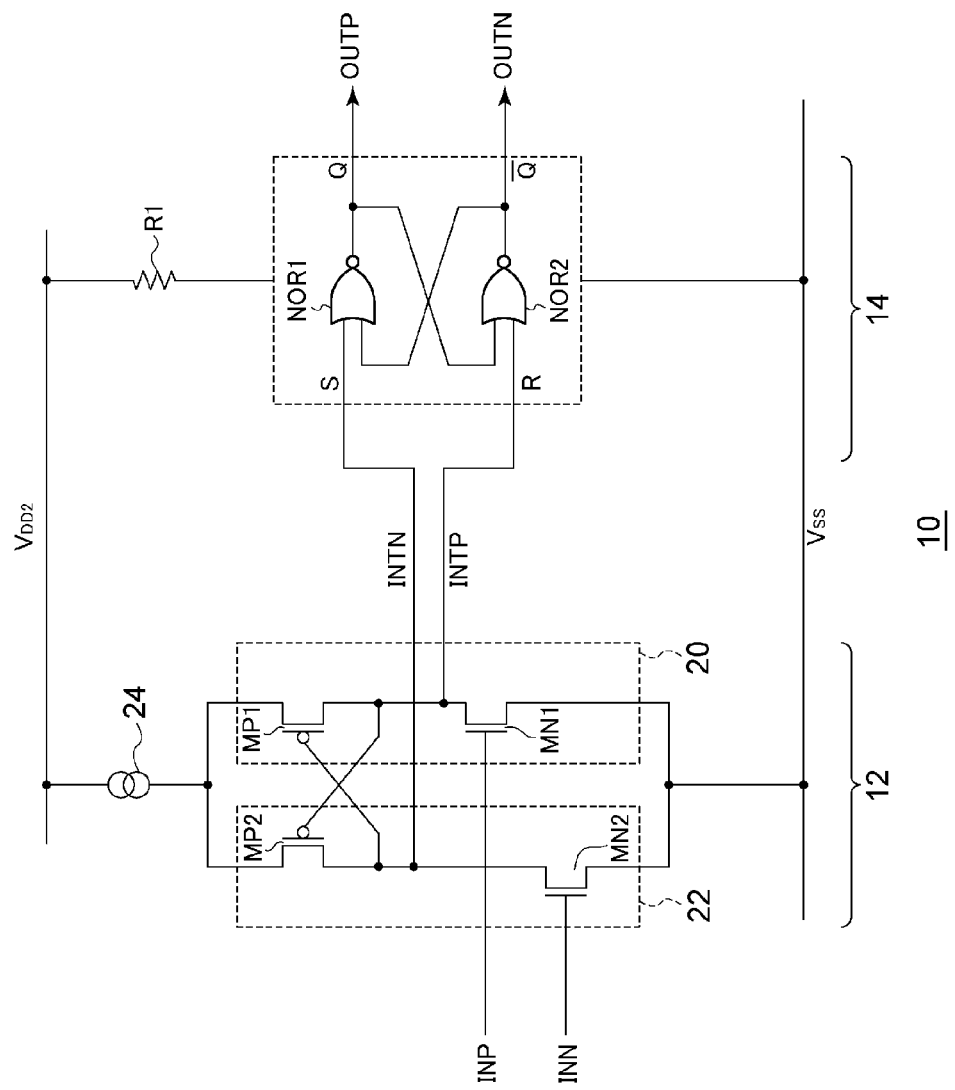
FIG. 9 is a circuit diagram showing an interface circuit according to a third modification.

FIG. 9 is a circuit diagram showing the interface circuit 10 according to a third modification. In this modification, the input signal IN to be received by the level shifter 12 is configured as a binary signal that switches between $V_{DD1}$ as high level and $V_{SS}$ as low level. The interface circuit 10 has the same basic configuration as that of the interface circuit 10 shown in FIG. 4. That is to say, the interface circuit 10 includes the level shifter 12 configured as an upstream stage and the latch circuit 14 configured as a downstream stage.

The first CMOS inverter 20 includes the first NMOS transistor MN1 and the first PMOS transistor MP1. The positive signal INP of the input signal IN is input to the gate of the first NMOS transistor MN1. The gate of the first PMOS transistor MP1 is connected to the output of the second CMOS inverter 22.

Similarly, the second CMOS inverter 22 includes the second NMOS transistor MN2 and the second PMOS transistor MP2. The negative signal INN of the input signal IN is input to the gate of the second NMOS transistor MN2. The gate of the second PMOS transistor MP2 is connected to the output of the first CMOS inverter 20.

The current limiting circuit 24 limits the current that flows through the first CMOS inverter 20 and the second CMOS inverter 22. The current limiting circuit 24 includes a current source arranged between the ground line $V_{SS}$ and both the first CMOS inverter 20 and the second CMOS inverter 22.

The latch circuit 14 includes a pair of cross-coupled NOR gates NOR1 and NOR2. The latch circuit 14 is configured as an SR flip-flop. The latch circuit 14 is arranged such that its set terminal S and reset terminal R are connected to the corresponding outputs of the first CMOS inverter 20 and the second CMOS inverter 22. Also, a resistor R1 used for limiting current may be arranged between the power supply line $V_{DD2}$ and the upper power supply terminal of the pair of NOR gates NOR1 and NOR2.

Figure 10:
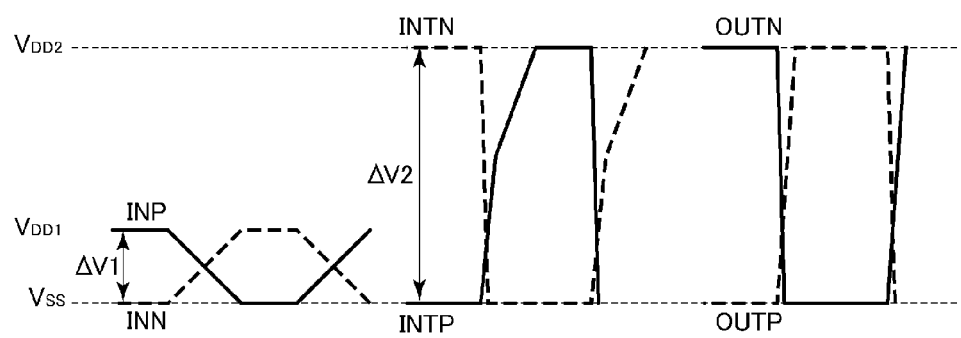
FIG. 10 is a waveform diagram showing a level diagram and a basic operation of the interface circuit shown in FIG. 9.

The above is the configuration of the interface circuit 10. Next, description will be made regarding the operation thereof. FIG. 10 is a waveform diagram showing a level diagram and a basic operation of the interface circuit 10 shown in FIG. 9. The operation waveform of the interface circuit 10 can be regarded as that obtained by electrically reversing the operation waveform shown in FIG. 6.

With the interface circuit 10 shown in FIG. 9, such an arrangement is also capable of generating the signal OUT with a high transition speed while reducing power consumption. Furthermore, by supplying the output signal OUTP/OUTN having such a high through rate to the second circuit 6 configured as a downstream stage, such an arrangement is capable of reducing the amount of through current that occurs in a CMOS circuit included in the second circuit 6, thereby providing reduced power consumption in the overall system operation.

With the interface circuit 10 shown in FIG. 9, the level shifter 12 configured as an upstream-stage has an NMOS input configuration. Thus, the intermediate signal INTP/INTN has a lower through rate at the positive edge than that at a negative edge. Thus, such an arrangement has a potential to set both the signal components INTP and INTN to low level at the same time. Thus, the latch circuit 14 configured as a downstream stage is provided with an NOR-type SR latch configured such that high-level/high-level input is prohibited and low-level/low-level input is allowed. Such an arrangement provides the interface circuit 10 with improved stability.

In addition, by providing the latch circuit 14 with the resistor R1 for limiting current. Thus, such an arrangement further reduces the operation current required for the latch circuit 14.

[Fourth Modification]

Figure 11:
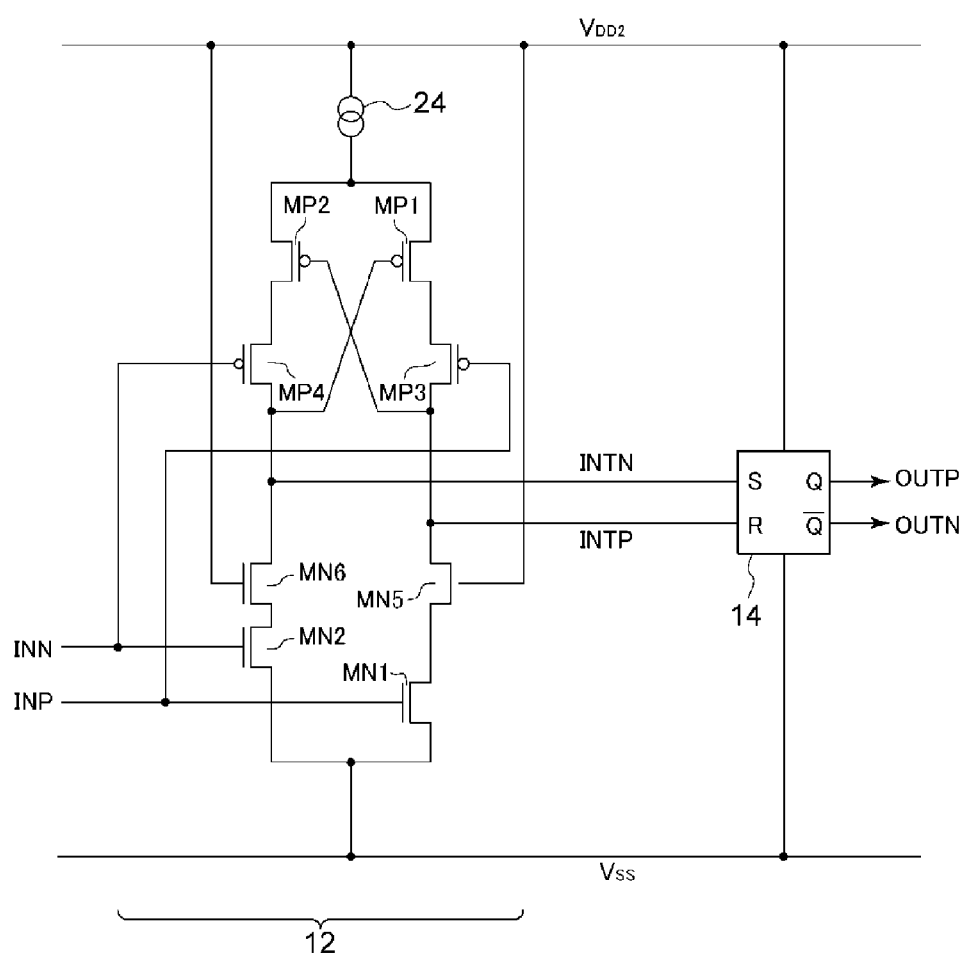
FIG. 11 is a circuit diagram showing an interface circuit according to a fourth modification.

FIG. 11 is a circuit diagram showing the interface circuit 10 according to a fourth modification. The interface circuit 10 shown in FIG. 11 has a configuration obtained by combining the interface circuit 10 shown in FIG. 9 and the second modification (FIG. 8). That is to say, the interface circuit 10 further includes transistors MP3, MP4, MN5, and MN6.

The third PMOS transistor MP3 and the fourth PMOS transistor MP4 respectively correspond to the third NMOS transistor MN3 and the fourth NMOS transistor MN4 shown in FIG. 8. Also, the fifth NMOS transistor MN5 and the sixth NMOS transistor MN6 respectively correspond to the fifth PMOS transistor MP5 and the sixth PMOS transistor MP6 shown in FIG. 8.

It should be noted that, in the circuit shown in FIG. 11, the third PMOS transistor MP3 and the fourth PMOS transistor MP4 may be omitted. Conversely, the fifth NMOS transistor MN5 and the sixth NMOS transistor MN6 may be omitted.

[Fifth Modification]

Figure 12A:
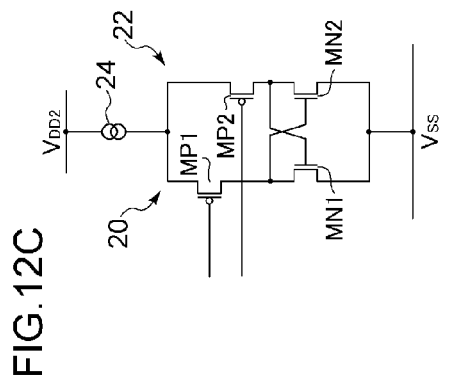
FIGS. 12A through 12F are circuit diagrams each showing an example configuration of a current limiting circuit included in a level shifter.
Figure 12B:
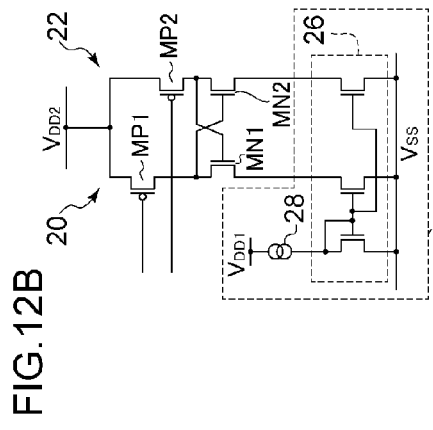
Figure 12C:
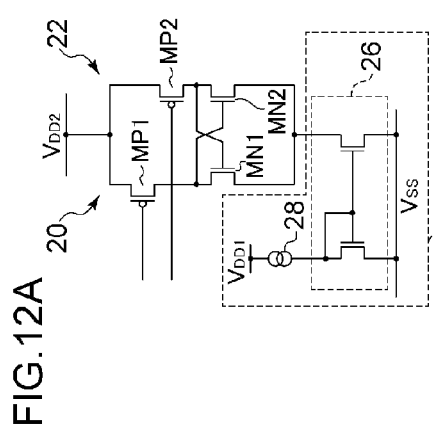

FIGS. 12A through 12C are circuit diagrams each showing an example configuration of the current limiting circuit 24 of the level shifter. The level shifters 12 shown in FIGS. 12A through 12C each correspond to the level shifter 12 shown in FIG. 4. The current limiting circuit 24 shown in FIG. 12A includes a current mirror circuit 26 and a reference current source 28. The current mirror circuit 26 generates a current obtained by multiplying, by a predetermined coefficient, a constant current generated by the reference current source 28, and supplies the current thus generated to the first CMOS inverter 20 and the second CMOS inverter 22.

The reference current source 28 may preferably be provided to the first circuit 4 operating with a low power supply voltage. This allows power consumption to be reduced as compared with an arrangement in which the reference current source 28 is provided to the second circuit 6.

In the current limiting circuit 24 shown in FIG. 12B, the current mirror circuit 26 separately limits the current that flows through the first COMS inverter 20 and the current that flows through the second CMOS inverter 22.

As shown in FIG. 12C, the current limiting circuit 24 may be arranged between the power supply line $V_{DD2}$ and both the first CMOS inverter 20 and the second CMOS inverter 22. The current limiting circuit 24 may be configured by replacing the NMOS transistors included in the current limiting circuit 24 shown in FIG. 12A or 12B, and by electrically reversing the circuit configuration.

Figure 12D:
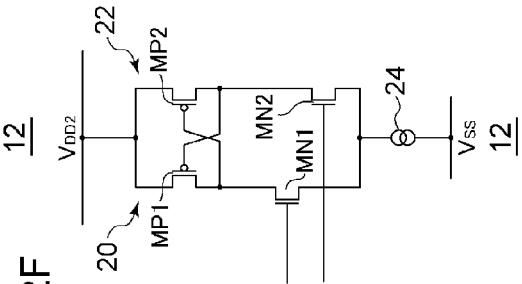
Figure 12E:
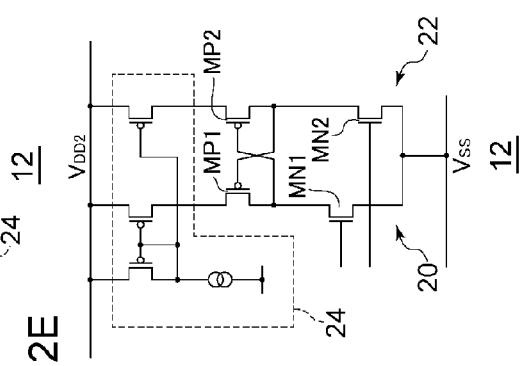
Figure 12F:
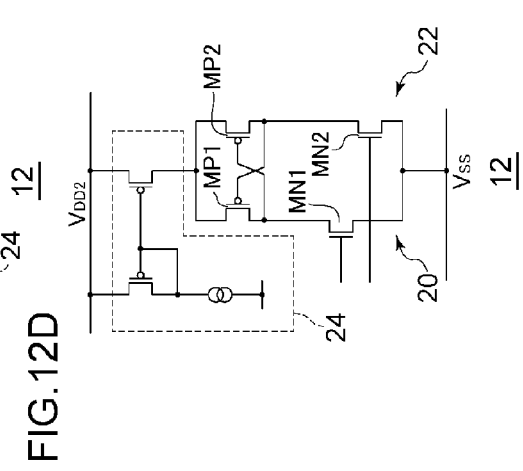

The level shifters 12 shown in FIGS. 12D through 12F each correspond to the level shifter 12 shown in FIG. 9. The current limiting circuits 24 shown in FIGS. 12D through 12F are respectively configured by inverting the polarities of the MOS transistors included in the current limiting circuits 24 shown in FIGS. 12A through 12C, and by electrically reversing the circuit configuration.

The configuration of the current limiting circuit 24 is not restricted to those shown in FIGS. 12A through 12F. For example, a resistor may be employed instead of or in addition to such a current source so as to limit the current that flows through the CMOS inverters. Also, MOS transistors each biased so as to function as a current source may be respectively arranged between the first NMOS transistor MN1 and the first PMOS transistor MP1 and between the second NMOS transistor MN2 and the second PMOS transistor MP2.

Next, description will be made regarding the usage of the interface circuit 10.

Figure 13:
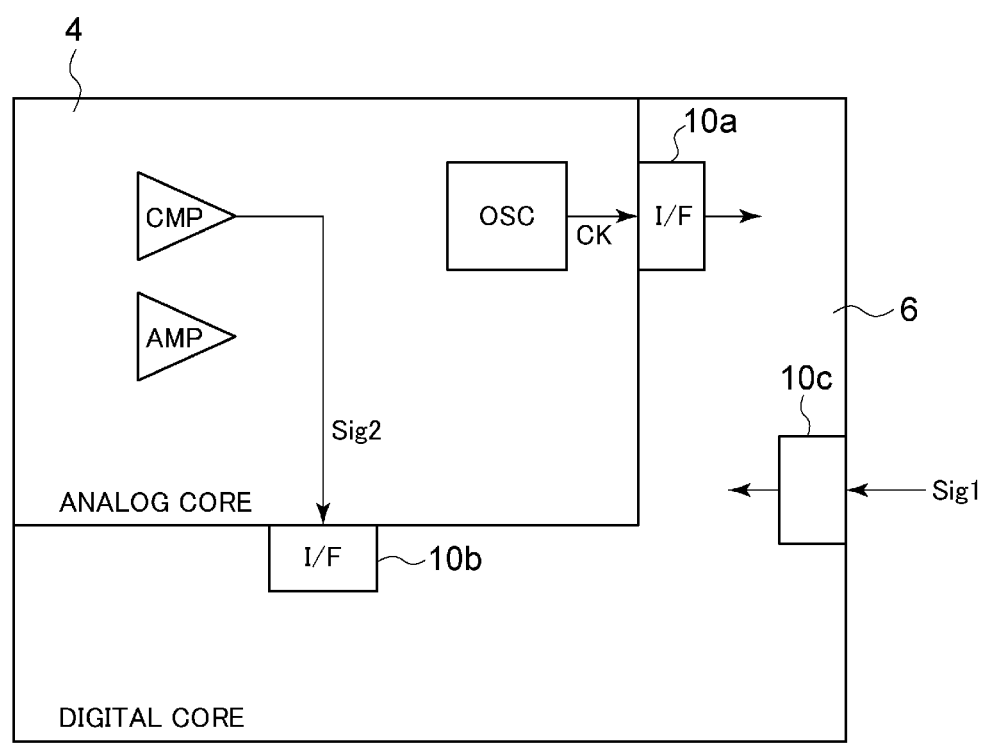
FIG. 13 is a block diagram showing a semiconductor integrated circuit using an interface circuit.

FIG. 13 is a block diagram showing a semiconductor integrated circuit using the interface circuit 10.

A semiconductor integrated circuit 2 includes the first circuit 4 and the second circuit 6. For example, the semiconductor integrated circuit 2 may be configured as an analog/digital hybrid circuit comprising the first circuit 4 configured as an analog circuit including multiple analog cores and the second circuit 6 configured as a digital circuit including a digital core.

The first circuit 4 includes analog circuits such as a comparator CMP, an amplifier AMP, an oscillator OSC, etc. The signal generated by such a comparator CMP, amplifier AMP, oscillator OSC, or the like, has a first voltage amplitude ΔV1. The second circuit 6 is provided to a positive/negative power supply rail configured to supply a voltage difference that is greater than the first voltage amplitude ΔV1.

Interface circuits 10a and 10b each receive a signal from the first circuit 4, and each output a signal to the second circuit 6. For example, the interface circuit 10a receives a clock signal CK having a small amplitude generated by an oscillator OSC, and supplies an output signal to an internal logic circuit included within the second circuit 6. The interface circuit 10b receives a signal Sig1 generated by a comparator CMP or the like, and supplies an output signal to an internal logic circuit included within the second circuit 6.

An interface circuit 10c receives a differential signal having a small amplitude from outside the semiconductor integrated circuit 2, and supplies an output signal to an internal logic circuit included within the second circuit 6.

As described above, the interface circuit 10 is applicable to various components included in the semiconductor integrated circuit 2 and to various kinds of usages.

While the preferred embodiments of the present invention have been described using specific terms, such description is for illustrative purposes only, and it is to be understood that changes and variations may be made without departing from the spirit or scope of the appended claims.

What is claimed is:

1. An interface circuit that receives a differential input signal having a first voltage amplitude from a first circuit, and that outputs an output signal having a second voltage amplitude to a second circuit, the interface circuit comprising:
    a level shifter that comprises a first CMOS inverter and a second CMOS inverter which are cross-coupled, and a current limiting circuit that limits a current that flows through the first CMOS inverter and the second CMOS inverter, and that converts the input signal into an intermediate signal which is a differential signal; and
    a latch circuit that receives the intermediate signal from the level shifter, and that switches a state thereof according to a positive signal and an negative signal of the intermediate signal, wherein the first CMOS inverter comprises:
    a first NMOS transistor having its gate coupled to an output of the second CMOS inverter;
    a second NMOS transistor having its source coupled to a drain of the first NMOS transistor, having its drain coupled to an output of the first CMOS inverter, and having its gate receiving a positive signal of the input signal;
    a first PMOS transistor having its gate receiving the positive signal of the input signal; and
    a fifth PMOS transistor having its source coupled to a drain of the first PMOS transistor, having its drain coupled to the output of the first CMOS inverter, and having its gate receiving a ground voltage,
    and wherein the second CMOS inverter comprises:
    a second NMOS transistor having its gate coupled to the output of the first CMOS inverter;
    a fourth NMOS transistor having its source coupled to a drain of the second NMOS transistor, having its drain coupled to the output of the second CMOS inverter, and having its gate receiving a negative signal of the input signal;
    a second PMOS transistor having its gate receiving the negative signal of the input signal; and
    a sixth PMOS transistor having its source coupled to a drain of the second PMOS transistor, having its drain coupled to the output of the second CMOS inverter, and having its gate receiving a ground voltage.

2. The interface circuit according to claim 1, wherein the latch circuit comprises a pair of cross-coupled NAND gates.

3. The interface circuit according to claim 1, wherein the current limiting circuit comprises a current source connected to sources of the first NMOS transistor and the second NMOS transistor.

4. The interface circuit according to claim 1, wherein the current limiting circuit comprises a current source connected to sources of the first PMOS transistor and the second PMOS transistor.

5. The interface circuit according to claim 1, wherein the latch circuit comprises a pair of cross-coupled NAND gates or otherwise a pair of cross-coupled NOR gates.

6. The interface circuit according to claim 1, monolithically integrated on a single semiconductor substrate.

7. A semiconductor integrated circuit comprising:
    a first circuit that generates an input signal having a first voltage amplitude;
    a second circuit provided with a power supply rail having a voltage difference that is greater than the first voltage amplitude; and
    the interface circuit according to claim 1, that receives a signal from the first circuit, and that outputs a signal to the second circuit.

8. The semiconductor integrated circuit according to claim 7, wherein the first circuit comprises an oscillator that generates a clock signal,
    and wherein the interface circuit receives the clock signal, and outputs a signal to the second circuit.

9. An interface circuit that receives a differential input signal having a first voltage amplitude from a first circuit, and that outputs an output signal having a second voltage amplitude to a second circuit, the interface circuit comprising:
    a level shifter that comprises a first CMOS inverter and a second CMOS inverter which are cross-coupled, and a current limiting circuit that limits a current that flows through the first CMOS inverter and the second CMOS inverter, and that converts the input signal into an intermediate signal which is a differential signal; and a latch circuit that receives the intermediate signal from the level shifter, and that switches a state thereof according to a positive signal and an negative signal of the intermediate signal, wherein the first CMOS inverter comprises:

a first NMOS transistor having its gate receiving a positive signal of the input signal;

a fifth NMOS transistor having its source coupled to a drain of the first NMOS transistor, having its drain coupled to an output of the first CMOS inverter, and having its gate receiving a power supply voltage;

a first PMOS transistor having its gate coupled to an output of the second CMOS inverter; and a third PMOS transistor having its source coupled to a drain of the first PMOS transistor, having its drain coupled to the output of the first CMOS inverter, and having its gate receiving the positive signal of the input signal, and wherein the second CMOS inverter comprises:

a second NMOS transistor having its gate receiving a negative signal of the input signal;

a sixth NMOS transistor having its source coupled to a drain of the second NMOS transistor, having its drain coupled to the output of the second CMOS inverter, and having its gate receiving the power supply voltage;

a second PMOS transistor having its gate coupled to the output of the first CMOS inverter; and a fourth PMOS transistor having its source coupled to a drain of the second PMOS transistor, having its drain coupled to the output of the second CMOS inverter, and having its gate receiving the negative signal of the input signal.

10. The interface circuit according to claim 9, wherein the latch circuit comprises a pair of cross-coupled NOR gates.

11. The interface circuit according to claim 9, wherein the current limiting circuit comprises a current source connected to sources of the first PMOS transistor and the second PMOS transistor.

12. The interface circuit according to claim 9, wherein the current limiting circuit comprises a current source connected to sources of the first NMOS transistor and the second NMOS transistor.

* * * * *